United States Patent [19]

Goedbloed

[11] Patent Number: 4,739,389

[45] Date of Patent: Apr. 19, 1988

[54] HIGH-FREQUENCY CIRCUIT ARRANGEMENT AND SEMICONDUCTOR DEVICE FOR USE IN SUCH AN ARRANGEMENT

[75] Inventor: Willem Goedbloed, Eindhoven, Netherlands

[73] Assignee: U.S. Philips Corporation, New York, N.Y.

[21] Appl. No.: 913,615

[22] Filed: Sep. 26, 1986

Related U.S. Application Data

[63] Continuation of Ser. No. 500,678, Jun. 3, 1983, abandoned.

[30] Foreign Application Priority Data

Jun. 18, 1982 [NL] Netherlands ............... 8202470

[51] Int. Cl.$^4$ ............................................. H01L 23/16
[52] U.S. Cl. ............................. 357/75; 357/74; 357/80; 357/41; 357/55; 357/40
[58] Field of Search ............... 357/74, 75, 80, 41, 357/55, 76, 40

[56] References Cited

U.S. PATENT DOCUMENTS

| 3,022,472 | 2/1962 | Tanenbaum et al. | 357/51 X |
| 3,138,744 | 6/1964 | Kilby | 357/51 X |
| 3,786,375 | 1/1974 | Sato et al. | 357/74 X |
| 3,996,603 | 12/1976 | Smith | 357/80 |
| 4,023,198 | 5/1977 | Malone et al. | 357/74 X |
| 4,092,664 | 5/1978 | Daus, Jr. | 357/80 |
| 4,122,479 | 10/1978 | Sugawara et al. | 357/75 X |
| 4,443,808 | 4/1984 | Kihara et al. | 357/34 X |
| 4,456,488 | 6/1984 | Gahle | 357/34 X |
| 4,463,322 | 7/1984 | Scott et al. | 357/41 X |

FOREIGN PATENT DOCUMENTS

| 54-11666 | 1/1979 | Japan | 357/74 X |
| 55-91165 | 7/1980 | Japan | 357/80 X |

Primary Examiner—Martin H. Edlow
Assistant Examiner—William A. Mintel
Attorney, Agent, or Firm—Robert T. Mayer; Steven R. Biren

[57] ABSTRACT

In a high-frequency circuit arrangement, passive parts of the circuit are realized in a semiconductor body in which active circuit elements of another semiconductor material are located in recesses in the semiconductor body. When the semi-conductor body is at least in part low-ohmic, a reference plane, for example, the ground plane, can extend very close to the elements of the circuit arrangement. Consequently, due to the shorter connections required, parasitic effects are considerably reduced. When only one active element is mounted and only connections for this element are formed on the semiconductor body, a very suitable support for mounting and measurement is obtained.

26 Claims, 2 Drawing Sheets

HIGH-FREQUENCY CIRCUIT ARRANGEMENT AND SEMICONDUCTOR DEVICE FOR USE IN SUCH AN ARRANGEMENT

This is a continuation of application Ser. No. 500,678 filed June 3, 1983, now abandoned.

BACKGROUND OF THE INVENTION

The invention relates to a high-frequency circuit arrangement, in particular for microwave uses, comprising an insulating substrate provided with a conducting pattern for a reference potential and a semiconductor device.

The invention further relates to a semiconductor device for use in such a high-frequency circuit arrangement.

Such circuit arrangements are used inter alia in circuits for receivers for satellite television.

Such a high-frequency circuit arrangement is described in the article "Low-noise 12 GHz front end designs for direct satellite television reception" in "Philips Technical Review", volume 39, no. 10 (see especially page 267 and FIG. 11). In the preamplifier shown therein, a plurality of transistors (in this case MESFET's) are mounted directly on a conducting pattern, which is formed on an insulating substrate of alumina. The source electrodes of the transistors are connected in an electrically conducting manner to the conductive pattern, which is connected via through-metallized holes in the substrate in an electrically conducting way to the other side of the substrate which is held at a reference potential, in this case ground potential. Such a construction serves to keep parasitic properties (capacitances, and self-inductances) at a minimum or at least to control them between given tolerances.

Various problems arise in the manufacture of such a high-frequency circuit arrangement. For example, the operation of mounting the transistors is often critical and time-consuming. Moreover, it is sometimes necessary to use selected transistors, which involves besides the cost of the additional measurement for this selection also cost as a result of rejection of transistors due to measuring tolerances, damage, transport etc.

However, the main problem, especially at higher frequencies, such as, for example, in use for satellite television, in which frequencies of approximately 12 GHz are utilized, is that the parasitic capacitances and self-inductances must be controlled so that they remain within acceptable limits for the transistor and its surroundings.

SUMMARY OF THE INVENTION

The present invention has for its object to reduce these problems to a minimum.

The invention is based on the recognition of the fact that parts of the semiconductor device can be designed in a simple manner so that the reference potential extends as far as the immediate proximity of the (high-frequency) transistors.

A high-frequency switching arrangement according to the invention is therefore characterized in that the semiconductor device comprises a first semiconductor body of a first semiconductor material which is provided at a main surface with at least one second semiconductor body in which an active circuit element is formed, and in that the first semiconductor body is provided with a low-ohmic semiconductor zone which extends at least locally as far as the first main surface and is connected in an electrically conducting manner to the conductive pattern for the reference potential.

The reference potential can then extend, as it were, via the low-ohmic semiconductor zone through the first semiconductor body as far as the immediate proximity of the second semiconductor body.

If the reference potential is ground potential, the parasitic capacitances and self-inductances of connection wires or contacts of the second semiconductor body, which may comprise, for example, a gallium arsenide field effect transistor, are considerably reduced. In this case, the strongly conducting semiconductor zone, which, if desired, may extend through the whole first semiconductor body, serves as a ground plane.

In this case, on the one hand parts of the second semiconductor body (for example, a connection contact of a transistor formed therein) can be directly connected to the low-ohmic semiconductor zone, while on the other hand these parts can be connected to a metal pattern which is provided on an electrically insulating layer, which covers the first semiconductor body. The insulating layer can be chosen to be very thin, in which case it acts as a dielectric and constitutes with a part of the metal pattern and an underlying strongly conducting semiconductor zone a capacitor to ground. If, on the other hand, a thick layer, for example, a glass layer, is chosen for the insulating layer, the underlying semiconductor body is substantially completely insulated dielectrically from the metal pattern. With the aid of the metal pattern, self-inductances can then be formed on the insulating layer. In this way, it is also possible to form resistors on the insulating layer.

It holds for all these elements, as for active circuit elements formed in the second semiconductor body, that due to the measure according to the invention, the ground plane is extended, as it were, into the first semiconductor body. Thus, the manufacture of high-frequency circuit arrangements and microwave circuit arrangements is considerably simplified because the metallized holes, as described in the aforementioned article, can be dispensed with for the major part or even completely.

The second semiconductor body, which comprises the active circuit element, can be mounted upside down on the first semiconductor body by means of soldering balls at the area of connection contacts of this circuit element (the so-called flip-chip mounting method).

However, the first semiconductor body preferably comprises a recess in which the second semiconductor body is located. This has advantages especially when the whole semiconductor device is again mounted by means of the flip-chip mounting method upside down on the insulating substrate. It should be noted that it is known per se from the U.S. Pat. No. 4,199,777 to provide a semiconductor body in a recess in another semiconductor body. The construction shown therein, however, serves to obtain reliable connections between an element formed in or on the first semiconductor body and an element provided in the recess. In said patent specification, no mention is made of a low-ohmic semiconductor zone in the first semiconductor body to counteract parasitic effects especially at high frequencies.

A semiconductor device for use in such a high-frequency circuit arrangement according to the invention is characterized in that the semiconductor device comprises a first semiconductor body of a first semiconductor material which is provided at a first main surface with at least one second semiconductor body in which an active circuit element is formed and which is further provided with a low-ohmic semiconductor zone which at least locally extends as far as the first main surface and as far as a second main surface parallel to the first main surface.

In addition to the advantages already mentioned above offered by the use of such a semiconductor device in a high-frequency circuit arrangement according to the invention, the semiconductor device itself still has a number of further advantages. For example, a number of semiconductor devices can be measured preliminarily before they are joined to form a high-frequency circuit arrangement, such a semiconductor device already comprising a number of components so that the high-frequency behavior of an assembly of components is measured preliminarily. Such a semiconductor device may comprise, for example, a metal-semiconductor field effect transistor (MESFET) made of gallium arsenide or selected bipolar transistors made of silicon, while capacitances and self-inductances are formed in the first semiconductor body of, for example, silicon. By such a construction, at the same time the presence of parasitic capacitances and self-inductances is considerably reduced.

Such a semiconductor device may alternatively comprise only one gallium arsenide transistor as the second semiconductor body, while, for example, self-supporting conductors (beam-leads) are provided, for example, on the first semiconductor body; thus, a more reliable high-frequency measurement of the transistors can be obtained so that, especially with the measurement of high-frequency parameters, a satisfactory selection is possible. Moreover, due to the fact that the gallium arsenide transistor now is not measured directly, the risk of damage is smaller.

Another advantage, especially when the surfaces of the first and the second semiconductor body are located substantially in the same plane, is that, when connections are established between connection points on the two semiconductor bodies, this process is effected substantially in the same plane so that during the provision of the connections the adjustment of the microscope need not be adapted.

BRIEF DESCRIPTION OF THE DRAWING

The invention will now be described more fully with reference to several embodiments and the drawing, in which.

Figure 1:
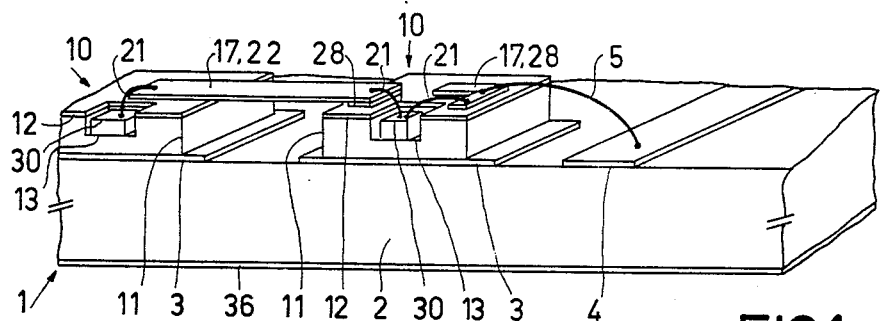
FIG. 1 shows diagrammatically a high-frequency circuit arrangement according to the invention.

The Figures are schematic and not drawn to scale, while for the sake of clarity in the cross-sections especially the dimensions in the direction of thickness are greatly exaggerated.

Semiconductor zones of the same conductivity type are generally cross-hatched in the same direction; in the various embodiments, corresponding parts are in general designated by like reference numerals.

DESCRIPTION OF THE PREFERRED EMBODIMENTS

FIG. 1 shows a high-frequency circuit arrangement 1 comprising on an insulating substrate 2, which consists, for example, of alumina, a conductive pattern 3, 4 of gold or aluminum which is deposited on the substrate 2 by generally known techniques, such as sputtering or vapor deposition. Parts 3 of the conductive pattern have a fixed reference voltage; for this purpose, in the present embodiment, the parts 3 are connected to ground potential. For the signal transport between various semiconductor devices 10, parts 4 of the metal pattern are present on the substrate 2 as transmission lines. These transmission lines are connected in an electrically conducting manner through wire connections 5 to parts of the metallization pattern 17 disposed on a semiconductor device 10. These parts of the metallization pattern 17 can be formed either by single contact surfaces 28, which are in turn connected through wire connections 21 to the second semiconductor body 30, or by a more complicated pattern, which in this example comprises inter alia a self-supporting connection 22 for direct contacting between two semiconductor devices 10. All the connections 5,21 can be provided in a generally known manner, such as, for example, by means of ultrasonic bonding or by means of thermocompression bonding. The insulating substrate 2 is provided on the other side in a generally known manner with a metal layer 36.

Figure 2:
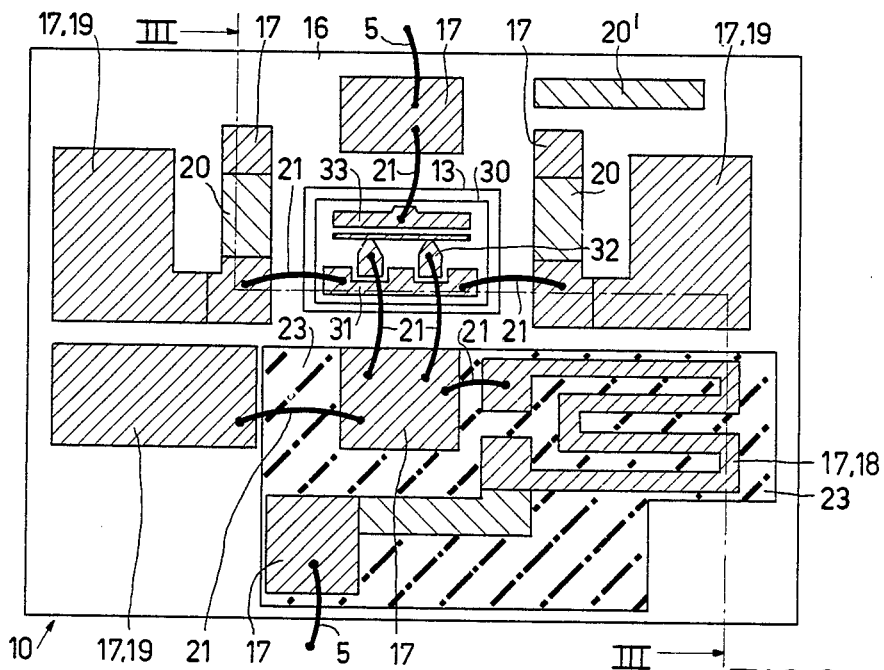
FIG. 2 shows diagrammatically in plan view a semiconductor device for use in such a high-frequency circuit arrangement.
Figure 3:
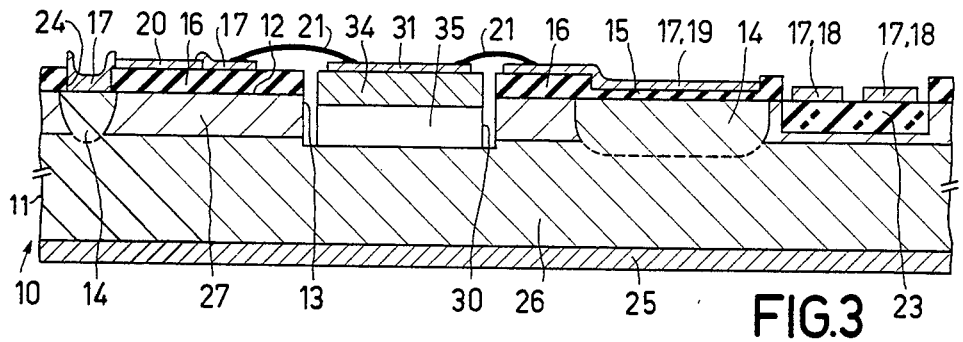
FIG. 3 shows diagrammatically a cross-section taken on the line III—III in FIG. 2.

A possible embodiment of the semiconductor device 10 is shown in FIGS. 2 and 3. This device comprises a first semiconductor body 11 having at a main surface 12 in a recess 13 a second semiconductor body 30, which is secured, for example, by means of electrically insulating glue, on the bottom of the recess 13.

The semiconductor body 11 comprises in this example an n-type silicon substrate 26 having a resistivity of approximately 5 mΩ·cm and a thickness of approximately 250 μm. In this example, the semiconductor body 11 comprises a p-type layer 27, which is obtained by epitaxial growth or by doping.

The assembly is covered with a layer 15, 16 of insulating material, such as, for example, silicon oxide, except at the area of the recess 13 having a depth of approximately 100 μm and at the area of the glass layer 23 having a thickness of approximately 40 μm. The oxide layer 16 has a thickness of approximately 1.5 μm, except at the area of capacitive elements 19 (see FIG. 3), at which a thin oxide layer 15 having a thickness of approximately 0.3 μm acts as a dielectric. Capacitors are thus formed by parts 19 of the metallization pattern 17 as the first plate, the thin oxide 15 as the dielectric and a low-ohmic semiconductor zone 14 as the second plate. The second plate is connected to ground in this example.

Furthermore, resistors 20 of a resistance material, such as, for example, nickel-chromium, are formed on the oxide 16. In this example, these resistors are connected at one end through a contact hole 24 to a low-ohmic semiconductor zone 14 and at their other end through the metal pattern 17 to the capacitors.

Besides a resistor 20, self-inductances 18 (see also FIG. 3) are formed on the glass layer 23 by shaping the metal pattern 17 into a meandering or spiraling form.

Parts of the metal pattern 17 are interconnected at a number of points by means of wire connections 21. Similar wire connections 21 also connect parts of the metal pattern 17 to contact surfaces 31, 32 and 33, which contact an active element in the second semiconductor body 30. In the present example, this element consists of a gallium arsenide-metal field effect transistor (MESFET) and comprises an active layer 34 grown onto a semi-insulating substrate 35. The semiconductor body 30 is secured on the bottom of the recess 13 by means of an electrically insulating glue. The contact metallizations 31, 32 and 33 act as source, gate and drain contact, respectively.

The first semiconductor body 11 is moreover provided with a metallization 25 for a satisfactory contact with the ground plane.

Figure 4:
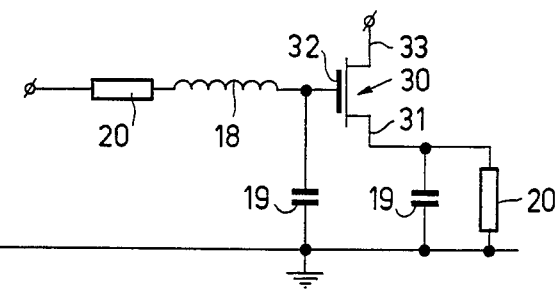
FIG. 4 shows the equivalent electric circuit diagram of the circuit arrangement realized in the semiconductor device shown in FIGS. 2 and 3.

The equivalent circuit of the semiconductor device shown in FIGS. 2 and 3 is represented diagrammatically in FIG. 4. The MESFET 30 has a source connection 31, which is connected to ground through a parallel-combination of a capacitance 19 and a resistor 20. The gate electrode 32 is controlled through a resistor 20 and a self-inductance 18. As is apparent from the plan view of FIG. 2, this control is effected through a connection wire 5, which contacts a part of the metal pattern 17 at the area of a contact metallization. Other connections between the elements of the circuit arrangement are constituted by connections 21 or the metal pattern 17.

Due to the presence of the low-ohmic semiconductor zones 14, 26, which are connected via the metallization 25 to the conducting pattern 3 at ground potential, the ground plane extends in the semiconductor body 10 which is particularly advantageous for high-frequency applications. Due to the fact that the connections 21 can be very short and substantially identical, they are now substantially free from variations in parasitic properties.

Figure 5:
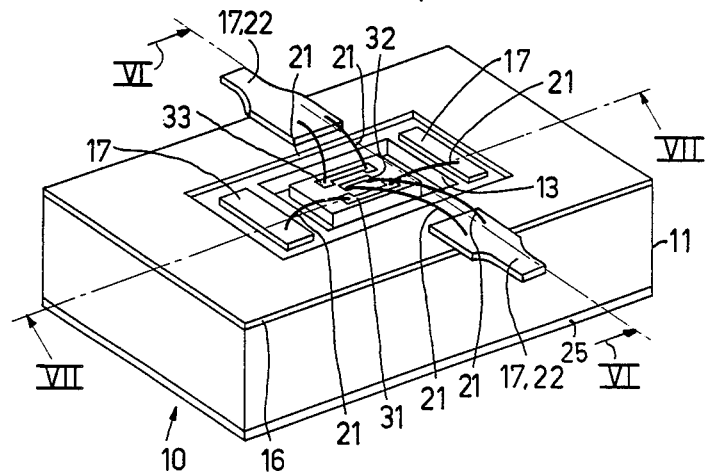
FIG. 5 shows diagrammatically an elevation of another semiconductor device for use in a high-frequency circuit arrangement according to the invention.
Figure 6:
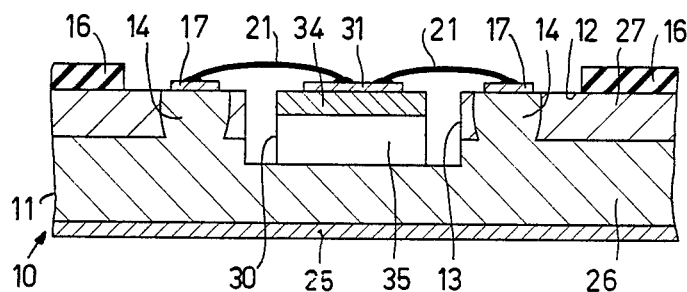
FIG. 6 shows diagrammatically a cross-section taken on the line VI—VI in FIG. 5.
Figure 7:
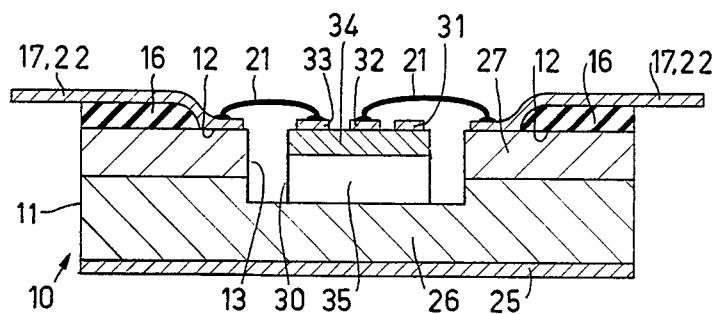
FIG. 7 shows diagrammatically a cross-section taken on the line VII—VII in FIG. 5.

The semiconductor device 10 of FIGS. 5, 6 and 7 has a semiconductor body 11 of silicon having a size of 1×1 mm and a thickness of approximately 250 μm. The semiconductor body 11 comprises a low-ohmic n-type substrate 26 having a resistivity of approximately 5mΩ·cm, on which is grown a high-ohmic (p or n-type) epitaxial layer 27. A recess 13 having a size of approximately 500×400 μm and a depth of approximately 100 μm has been etched into the silicon body 11. A metal-gallium arsenide field effect transistor (MESFET) having a thickness of approximately 100 μm is secured in this recess. The field effect transistor 30 is provided with contact surfaces 31, 32, 33 for a source, a gate and a drain contact, respectively. The source contact surface 31 is now connected (see FIG. 6) in electrically conducting manner through connections 21 to a part of the metal pattern 17, which in this example is directly provided on the main surface 12 of the first semiconductor body 11 and contacts the low-ohmic semiconductor zone 14, which extends at the area of the metallization pattern 17 as far as the surface 12. The source contact surface is consequently connected directly through a low-ohmic current path consisting of the connection 21, the pattern 17, the semiconductor zone 14 and the substrate 26 to the contact metallization 25 on the lower side of the semiconductor body 11. Such a configuration is therfore particularly suitable for use in a circuit arrangement with a grounded source zone, in which the lower side of the semiconductor body 11 is mounted on a ground plane, for example, by means of soldering. Otherwise, the reference numerals again have the same meaning as in the preceding example. The self-supporting conductors 22, 17 are connected through wire connections 21 in an electrically conducting manner to the gate contact surface 32 and the drain contact surface 33 of the field effect transistor 30.

With the aid of such a construction, due to the fact that the connections 22, 25 have comparatively large dimensions, measurement (and selection) can be carried out preliminarily in a more reliable manner than when measurement takes place directly on the contacts 31, 32, 33 of the gallium arsenide field effect transistor. The risk of damage is then also considerably reduced.

For applications in which the source zone is not connected to ground, the source contact can be connected in a similar manner to the gate and drain contacts through a connection 21 to a self-supporting conductor. In such an arrangement, the group plane can be brought near the surface 12 by ensuring that, for example, the whole first semiconductor body 11 consists of a single low-ohmic substrate 26. Thus, it is achieved that the conductors 22, which in general form part of signal lines, are located very closely along the ground level so that the semiconductor device exhibits a very satisfactory high-frequency behavior (especially for microwave applications). Similar advantages are of course also obtained for the device of FIGS. 2 to 4 and modifications thereof.

It goes without saying that the invention is not limited to the aforementioned embodiments, but that various modifications are possible within the scope of the invention. For example, the contacting need not necessarily be obtained through the self-supporting conductors 22 and wire connections 5, but the first semi-conductor body may be provided with soldering-balls which make it possible to carry out upside down (flip-chip) mounting. In this case, the metallization 25 may be omitted, if desired. Of course, the silicon body 11 may be used not only for the realization of said passive elements but also for the realization of active elements, such as, for example, a Schottky diode for protection, etc. Further, a circuit device according to the invention may itself be incorporated in a larger assembly, such as a microwave circuit, connect a ground plane on the other side of a support in an electrically conducting manner to a contact surface on which the device according to the invention is soldered. With respect to the construction with loose circuit elements, the number of metallized holes is then drastically reduced.

Also in the circuit arrangement of FIGS. 2 to 4, various modifications may be provided, such as, for example, the addition of a further resistance element 20' shown diagrammatically in FIG. 2. Additionally, it stands to reason that other semiconductor materials and connection methods may be used. It is also possible to arrange several transistors in the same recess or in different recesses.

The embodiments of the invention in wich an exclusive property or privilege is claimed are defined as follows:

1. A high frequency microwave circuit arrangement comprising an insulating substrate, a reference conducting pattern on said substrate for providing a reference potential, and a microwave semiconductor device on said substrate, said semiconductor device comprising a first semiconductor body of a first semiconductor material and at least a second semiconductor body of a second semiconductor material, said first semiconductor body having first and second oppositely-located major sides, a metallization pattern on said first semiconductor body at said first major side, said first semiconductor body having a major semiconductor surface at said first major side, said second semiconductor body comprising an active microwave semiconductor circuit element on said first semiconductor body at said first major side thereof, said first semiconductor body comprising a low-ohmic semiconductor zone with respect to said first semiconductor body, which low-ohmic zone at least partially adjoins said major semiconductor surface, said low-ohmic zone-being electrically connected to said reference conducting pattern, and said active microwave semiconductor circuit element being electrically connected to said metallization pattern.

2. A circuit arrangement as claimed in claim 1, characterized in that the first semiconductor body comprises, at said first major side, a layer of insulating material covering said major semiconductor surface, at least part of said metallization pattern extending on said layer.

3. A semiconductor device as claimed in claim 1, characterized in that the semiconductor device comprises a first semiconductor body, said first semiconductor body having first and second oppositely-located major sides, and comprising a low-ohmic semiconductor zone with respect to said first semiconductor body, which low-ohmic zone at least partially adjoins a first major semiconductor surface located at said first major side of said first semiconductor body and a second major semiconductor surface located at said second major side of said first semiconductor body.

4. A high-frequency circuit arrangement as claimed in claim 1, characterized in that the first semiconductor body has a recess in which the second semiconductor body is disposed, said recess being of such a depth that said first and second semiconductor bodies are substantially coplanar at their upper surfaces.

5. A high-frequency circuit arrangement as claimed in claim 1 or 2, characterized in that the second semiconductor body comprises a second semiconductor material different from that of the first semiconductor material.

6. A circuit arrangement as claimed in claim 1 or 4, characterized in that the low-ohmic semiconductor zone comprises substantially the whole first semiconductor body.

7. A circuit arrangement as claimed in claim 1 or 4, characterized in that the low-ohmic semiconductor zone has a resistivity of at most 0.05Ω·cm.

8. A circuit arrangement as claimed in claim 4, characterized in that the low-ohmic semiconductor zone is connected, at the area of the main surface of the first semiconductor body in an electrically conducting manner, to a connection of a circuit element formed in the second semiconductor body.

9. A circuit arrangement as claimed in claim 2, characterized in that at least a portion of said metallization pattern forms a capacitor with the subjacent layer of insulating material as the dielectric and the underlying part of the first semiconductor body.

10. A circuit arrangement as claimed in claim 2, characterized in that at least a portion of said metallization pattern has one of a meander form and a helical spiral form.

11. A circuit arrangement as claimed in claim 2, characterized in that the metallization pattern has two connection areas, between which a resistance layer is disposed.

12. A circuit arrangement as claimed in claim 2, characterized in that a part of the metallization pattern extends as a self-supporting conductor beyond the periphery of the first semiconductor body.

13. A circuit arrangement as claimed in claim 10, characterized in that the metallization pattern is locally insulated from the first semiconductor body by a glass layer having a thickness of at most 100 μm.

14. A semiconductor device as claimed in claim 3, characterized in that the first semiconductor body is provided at the second major semiconductor surface with a contact metallization.

15. A semiconductor device as claimed in claim 3, characterized in that the first semiconductor body has a recess at said first major side in which the second semiconductor body is disposed.

16. A semiconductor device as claimed in claim 3, characterized in that the second semiconductor body comprises a second semiconductor material different from the first semiconductor material.

17. A semiconductor device as claimed in claim 3, characterized in that the low-ohmic semiconductor zone comprises substantially the whole first semiconductor body.

18. A semiconductor device as claimed in claim 3, characterized in that the low-ohmic semiconductor zone has a resistivity of at most 0.05Ω·cm.

19. A semiconductor device as claimed in claim 3, characterized in that the low-ohmic semiconductor zone is connected, at the area of the first major side of the first emiconductor body in an electrically conducting manner, to a connection of a circuit element formed in the second semiconductor body.

20. A semiconductor device as claimed in claim 3, characterized in that a circuit element formed in the second semiconductor body is connected in an electrically conducting manner to at least part of a metallization pattern provided on a layer of insulating material on the first major semiconductor surface of the first semiconductor body.

21. A semiconductor device as claimed in claim 20, characterized in that at least a portion of the metallization pattern forms a capacitance with the subjacent layer of insulating material as the dielectric and with the underlying part of the first semiconductor body.

22. A semiconductor device as claimed in claim 20, characterized in that at least a portion of the metallization pattern has one of a meander form and a spiral form.

23. A semiconductor device as claimed in claim 20, characterized in that the metallization pattern has two connection areas between which a resistance layer is disposed.

24. A semiconductor device as claimed in claim 20, characterized in that a part of the metallization pattern extends as a self-supporting conductor beyond the periphery of the first semiconductor body.

25. A semiconductor device as claimed in claim 22, characterized in that the metallization pattern is locally insulated from the first semiconductor body by a glass layer of at most 100 μm.

26. A semiconductor device as claimed in claim 3, characterized in that the first semiconductor body comprises silicon and the second semiconductor body comprises of a III–V compound.

* * * * *